United States Patent
Loiselet

(10) Patent No.: US 8,288,175 B2
(45) Date of Patent: Oct. 16, 2012

(54) METHOD OF MANUFACTURE OF AN INTEGRATED CIRCUIT PACKAGE

(75) Inventor: Emmanuel Loiselet, Elancourt (FR)

(73) Assignee: Thales Holdings UK PLC, Surrey (GB)

( * ) Notice: Subject to any disclaimer, the term of this patent is extended or adjusted under 35 U.S.C. 154(b) by 0 days.

(21) Appl. No.: 13/015,057

(22) Filed: Jan. 27, 2011

(65) Prior Publication Data

US 2011/0207242 A1    Aug. 25, 2011

(30) Foreign Application Priority Data

Feb. 2, 2010    (GB) .................................. 1001707.7

(51) Int. Cl.
H01L 21/66    (2006.01)

(52) U.S. Cl. ............ 438/14; 438/15; 438/109; 438/613; 257/E23.021; 257/E23.069

(58) Field of Classification Search ................... 438/14, 438/15, 109, 613; 257/E23.021, E23.069
See application file for complete search history.

(56) References Cited

U.S. PATENT DOCUMENTS

| | | | |
|---|---|---|---|
| 6,070,478 A * | 6/2000 | Krajec et al. | 73/865.9 |
| 6,262,571 B1 | 7/2001 | Krajec | |
| 6,281,046 B1 | 8/2001 | Lam | |
| 6,411,113 B1 * | 6/2002 | Bjomeklett | 324/755.05 |
| 7,348,597 B1 | 3/2008 | Degerstrom et al. | |
| 2005/0090027 A1 | 4/2005 | Aghababazadeh et al. | |
| 2006/0094134 A1 | 5/2006 | Yoshida | |
| 2008/0174972 A1 | 7/2008 | Bygdo et al. | |
| 2009/0268642 A1 * | 10/2009 | Knox | 370/277 |

FOREIGN PATENT DOCUMENTS

| | | |
|---|---|---|
| EP | 2 166 616 A1 | 3/2010 |
| WO | WO 98/47010 A1 | 10/1998 |
| WO | 00/30206 | 5/2000 |

OTHER PUBLICATIONS

Great Britain Search Report dated May 12, 2010 in GB1001707.7 Patent Application.
Great Britain Search Report dated Apr. 26, 2011 for GB 1001707.7.

* cited by examiner

*Primary Examiner* — Julia Slutsker
(74) *Attorney, Agent, or Firm* — Stroock & Stroock & Lavan LLP

(57) ABSTRACT

A method of manufacturing an integrated circuit, IC, package comprising radio frequency, RF, components, the method comprising:
   electrically connecting a printed circuit pattern on an external major surface of an IC assembly to an RF testing motherboard by bringing them together with an interposed adaptor layer, the adaptor layer comprising a double-sided PCB, printed circuit board, with conductive vias between its printed circuit layers;
   RF testing the IC assembly using the RF testing motherboard, while RF tuning components of the IC assembly;
   and separating the IC assembly and connecting its major surface to a solder ball grid array, BGA, which has substantially the same RF impedance as the adaptor at RF signal paths from the IC assembly to the BGA.

7 Claims, 5 Drawing Sheets

METHOD OF MANUFACTURE OF AN INTEGRATED CIRCUIT PACKAGE

This invention relates to a method of manufacturing an integrated circuit package comprising RF components. It is particularly useful where the RF components need to be finely tuned during manufacture, and it is particularly effective where the package operates at high frequencies such as in the X, Ku or K wavebands.

RF testing motherboards are available for interfacing electrically with the printed circuits of integrated circuit assemblies, during manufacture. One way of providing an interface between the printed circuit of the integrated circuit package and the RF testing motherboard is to interpose an elastomeric "mattress", of the order of 1 mm in thickness, and having a multiplicity of parallel conductive paths between its major surfaces, formed by thin wires which are mutually electrically insulated. For devices intended to work at high RF frequencies such as in the X, Ku or K wavebands, above about 5 GHz, the elastomeric mattress does not give a sufficiently consistent impedance at the interface, and this causes problems with RF testing including the tuning of tuneable components in the package.

Integrated circuit packages operable at such high frequencies advantageously are connected to solder ball grid arrays, BGA, to make reliable electrical connections to external RF components. Pre-selected balls of the BGA are soldered to the printed circuit of the integrated circuit package, and these balls are then correspondingly connected to the external RF component. It has not been possible hitherto to provide a consistent RF interface between an integrated circuit package with a BGA, and an RE testing motherboard. The use of elastomeric mattresses of the type described above leads to the same problem of inconsistent impedance at the interface, which varies for example with mechanical pressure and the degree of compression of the mattress. It is also significant that these elastomeric mattresses are expensive. A further problem is that such mattresses have been found to erode the solder balls of the BGA, so that they are significantly damaged after several testing processes.

Accordingly, the present invention provides a method of manufacturing an integrated circuit, IC, package comprising radio frequency, RE, components, the method comprising: electrically connecting a printed circuit pattern on an external major surface of an IC assembly to an RF testing motherboard by bringing them together with an interposed adaptor layer, the adaptor layer comprising a double-sided PCB, printed circuit board, with conductive vias between its printed circuit layers; RF testing the IC assembly using the RF testing motherboard, whilst RF tuning components of the IC assembly; and separating the IC assembly and connecting its major surface to a solder ball grid array, BGA, which has substantially the same RF impedance as the adaptor at RF signal paths from the IC assembly to the BGA.

This method allows the testing to take place before the assembly of the BGA, by providing an interface to the RF testing motherboard which simulates the impedance with the BGA in place. The adaptor layers can be made very much less expensive than the elastomeric mattresses. The invention eliminates the problem of wear of the solder balls during testing. Since RF tuning can take place during the testing and prior to assembly with the BGA, it becomes possible to manufacture integrated circuit packages with fine tuneable RF components operable at high frequencies, such as microwave circulators, sometimes known as isolators, with ball grid arrays.

In order that the invention may be better understood, a preferred embodiment will now be described, by way of example, with reference to the accompanying drawings, in which.

Figure 1:
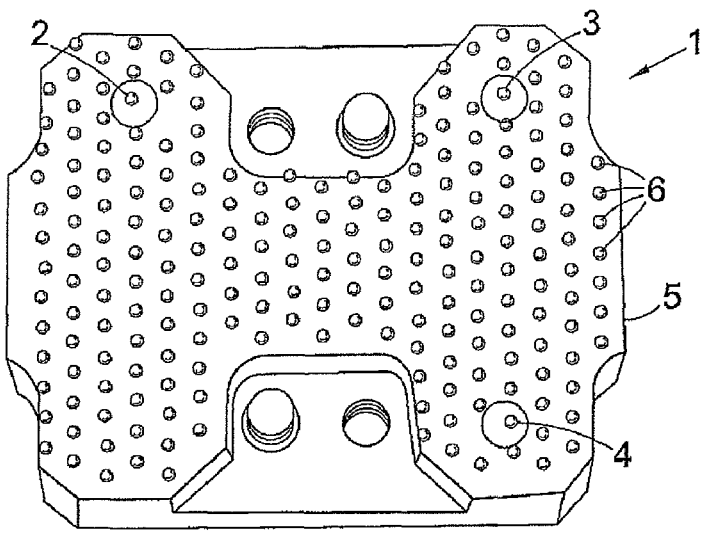
FIG. 1 is a plan view, partly in perspective, of a major surface of a microwave circulator connected to a ball grid array.

A microwave circulator 1, as shown in FIG. 1, has three ports 2, 3 and 4 consisting of coaxial transitions between waveguides on a PCB (not shown) and balls 6 of a ball grid array, BGA, on a steel frame 5. The balls are typically 0.4 mm diameter tin-lead alloy solder material, in a regular grid, all in the same plane. A microwave circulator 1 is an example of an integrated circuit package which may be manufactured in accordance with the preferred embodiment of the invention.

Figure 2:
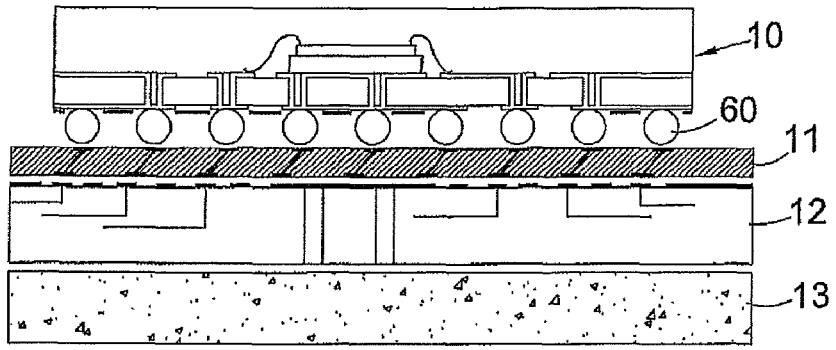
FIG. 2 is a sectional view through an integrated circuit package with a ball grid array, being tested with an interposed elastomeric mattress.

FIG. 2 illustrates a conventional method of testing an integrated circuit assembly 10 which has a BGA 60. An RF testing motherboard 12, with a printed circuit pattern on its major surface, and placed over a mounting plate 13, interfaces electrically with the BGA 60 through an elastomeric mattress 11. The elastomeric mattress, which may be 0.5 mm or 1 mm thick, has a multiplicity of electrically isolated parallel conductive paths formed by fine wires, extending between the major surfaces of the mattress at an acute angle. One such mattress is manufactured by Ironwood Electronics, These mattresses (otherwise known as sockets or interconnectors) operate typically in a bandwidth of 6.5 to 10 GHz, operate without the need for solder connections, and can be mounted onto a PCB using screws and nuts (not shown). Other such mattresses or interconnectors are available from Shin Etsu Company.

As described above, the use of such conductive interconnectors or mattresses leads to inconsistent impedances at the signal paths, and also to some wear of the solder balls in the case of low compression type interfaces or those with exposed wires, This makes them unsuitable for the testing of integrated circuits intended for high frequency RF, whether the testing is done before or after the connection of the BGA.

Figure 3:
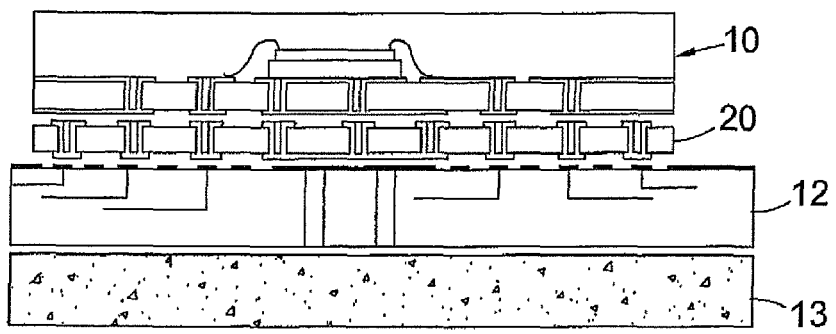
FIG. 3 is a sectional view corresponding to FIG. 2 but illustrating a preferred embodiment of the invention using an interposed adaptor layer instead of the elastomeric mattress.
Figure 4:
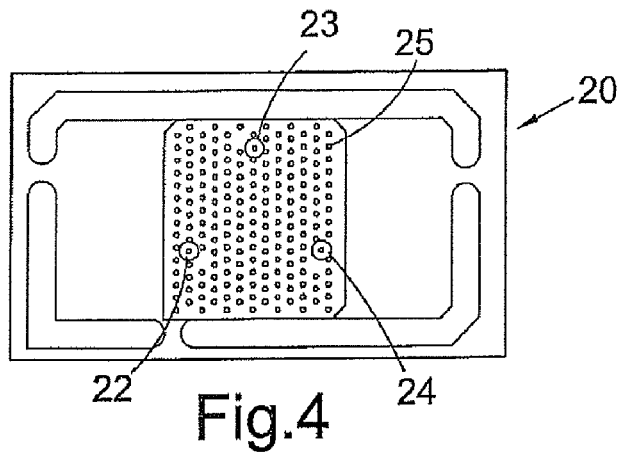
FIGS. 4, 5 and 6 are respectively bottom, top and exploded views of an adaptor layer for use in the method embodying the invention, the top layer of the adaptor layer being at the bottom of FIG. 6.
Figure 5:
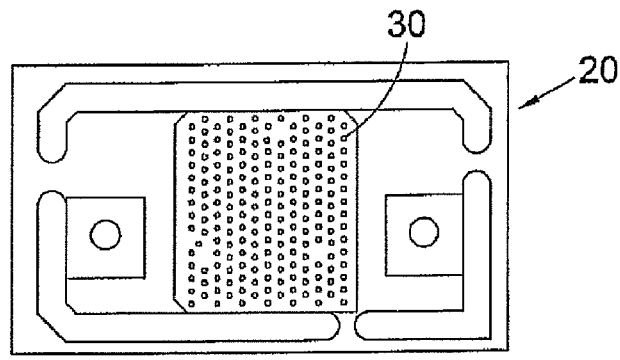
Figure 6:
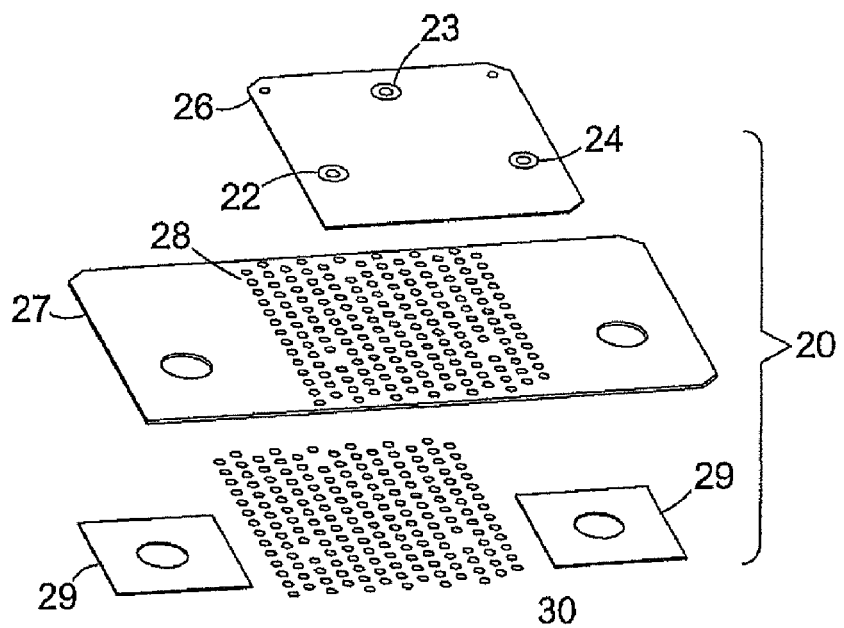

Such problems are overcome by the preferred method embodying the invention, illustrated in FIG. 3. A rigid double-sided PCB 20, with conductive vias between its printed circuit patterns, forms an adaptor layer, interposed between the integrated circuit assembly 10, which might for example comprise a microwave circulator 1, and the RF testing motherboard 12. The structure of the adaptor layer 20, in one example, is shown in FIGS. 4, 5 and 6. The adaptor layer 20 comprises a bottom plate 26 with coaxial RF signal paths 22, 23 and 24, which are also shown in FIG. 4 which is a bottom plan view. The bottom plate 26 is perforated with blind via holes 25, shown in FIG. 4. A middle layer 27 has perforations 28, corresponding with the blind via holes 25, and a top layer comprises end plates 29 and a central array 30 of metallic pads. Electrical vias 25 may be formed selectively between the layers, in a conventional fashion.

The PCB 27 of the adaptor layer 20 is preferably a rigid substrate and may consist of Rogers RO4003 substrate. However, a softer laminate could alternatively be used, such as the Rogers RO3003 substrate or an equivalent, such as an expanded foam material or a liquid crystal polymer material, The apertures 28 may be formed as laser via holes. To improve the BGA substrate deflection capability and the solder ball flatness tolerance, these laser via holes could be made at an acute angle to the normal to the plane of the board, for example with a 30° tilt to the normal.

Figure 7:
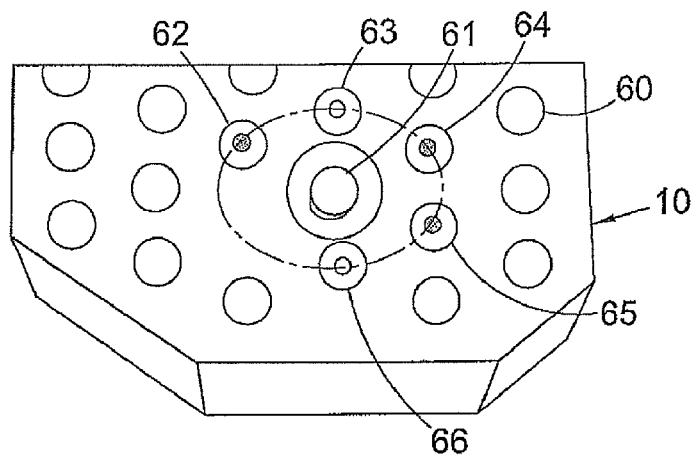
FIG. 7 is a plan view, partly in perspective, of part of a ball grid array connected to a microwave circulator, illustrating a coaxial signal path.
Figure 8:
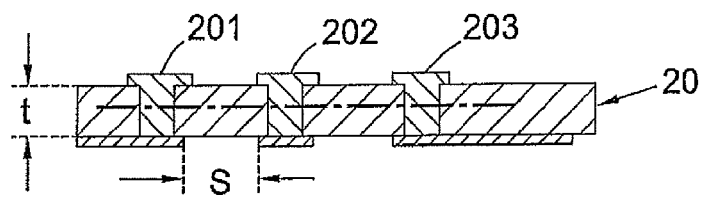
FIG. 8 is a section through part of an adaptor layer for use in a preferred embodiment of the invention, the adaptor layer simulating the effect of the ball grid array of FIG. 7.

It is important that the adaptor layer 20 should provide a reasonably accurate simulation of the impedance of the BGA 60, at the RF wavebands over which the integrated circuit is to operate. With reference to FIG. 7 and FIG. 8, this is achieved by mathematical modelling of the impedances using standard modelling applications, not described here but well known to the skilled reader.

For example, a simplified formula for the coaxial line impedance Z between an RF via hole of diameter a separated from ground by a radial distance b, across board of a dielectric characteristic (constant) $\in$, is:

$$Z = 60 \ln(b/a)/\sqrt{\in}.$$

Using this formula, for RO4003 substrate $\in=3.38$, if $a=0.25$ mm and $b=1.35$ mm, then $Z=55\Omega$. For air instead of the dielectric board, $Z=60\Omega$.

The integrated circuit assembly 10 complete with the BGA 60 is illustrated in part in FIG. 7, which shows a coaxial transition formed by a central ball 61 surrounded by 5 grounded balls 62, 63, 64, 65 and 66. It is intended that the impedance at this transition should be as close as possible to $50\Omega$, although manufacturing tolerances of plus or minus $10\Omega$ would put this to an acceptable range of $40\Omega$ or $60\Omega$. FIG. 8 illustrates a corresponding portion of the adaptor layer 20, intended to simulate the effects of the BGA. The adaptor layer 20 includes projecting printed circuit layers on both sides. Vias 201, 202 and 203 are formed between these layers, using copper or another appropriate electrical conductor. These vias are formed through the apertures 28. The spacing S between the conductive paths, the thickness t of the PCB, and the dielectric constants of the PCB material, the copper material and air, all influence the RF impedance at this coaxial transition. By way of example, simulating a BGA whose balls are 0.4 mm in diameter in an array with a 0.8 mm pitch and a 0.4 mm offset between the rows of balls, the vias 201, 202 are 0.8 mm apart between their axes; the copper pad over via 202 is 0.5 mm in diameter; the thickness t is 0.2 mm; each via hole is 0.25 mm in diameter; and the clearance S is 0.33 mm.

The method according to this preferred embodiment of the invention will now be described.

As shown in FIG. 3, the IC assembly 10 is brought into electrical connection with the external major surface of the RF testing motherboard 12, with the adaptor layer 20 interposed. Sufficient normal pressure is applied across these components to ensure an adequate electrical connection, without mechanical distortion. The RF testing motherboard is then used to transmit and receive test signals into and out of the IC assembly 10, using conventional techniques not described in this specification. During this process, RF tuneable components of the IC assembly 10 are tuned, so that they reach the required frequency performance. For example, where the assembly includes a microwave circulator, the ports may be tuned by the application of an appropriate amount of solder or tuning stuff. Once the tuning and testing has been completed, the IC assembly 10 is separated and is connected, in a conventional manner, to a BGA such as BGA 6 in FIG. 1 and BGA 60 in FIG. 7. Since the adaptor layer 20 has substantially the same RF impedance characteristics as those of the BGA, there should be no need for any further tuning after the assembly of the BGA.

The invention has been tested and compared with the use of elastomeric mattresses in place of the adaptor layer 20. It has been found to have significantly improved impedance matching and significantly lower transmission losses.

Figure 9:
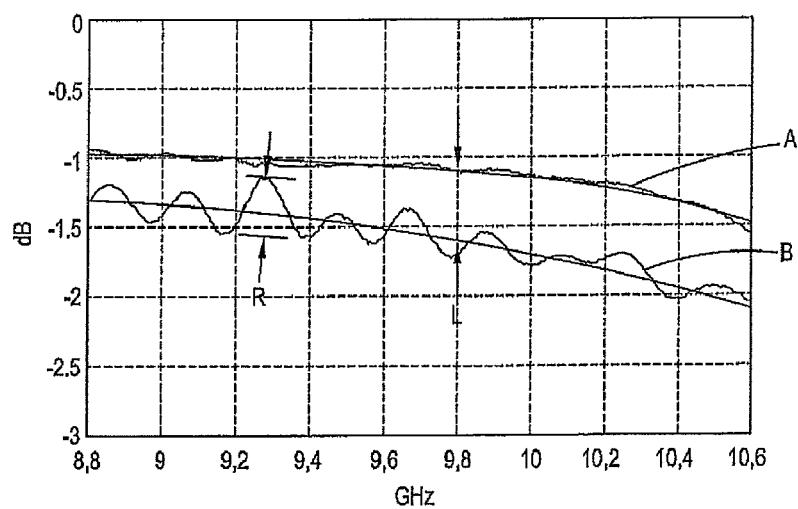
FIG. 9 is a graph comparing RF signal loss between an IC package and an RF testing motherboard, with and without the interposition of an elastomeric mattress.

The testing of an MESL, (Microwave Limited, Lochend Industrial Estate, Newbridge, Edinburgh, EH28 8LP, Scotland) microwave circulator is illustrated in FIG. 9. The signal transmission loss between the circulator and the RF testing motherboard is shown as a function of frequency: graph A without the elastomeric mattress, with direct contact between the IC assembly and the RF testing motherboard, and graph B, with an interposed Shin Etsu elastomeric mattress. Graph B shows a significantly greater transmission loss L compared with graph A. Graph B also shows substantial ripple R in the variation of transmission loss with frequency.

Figure 10:
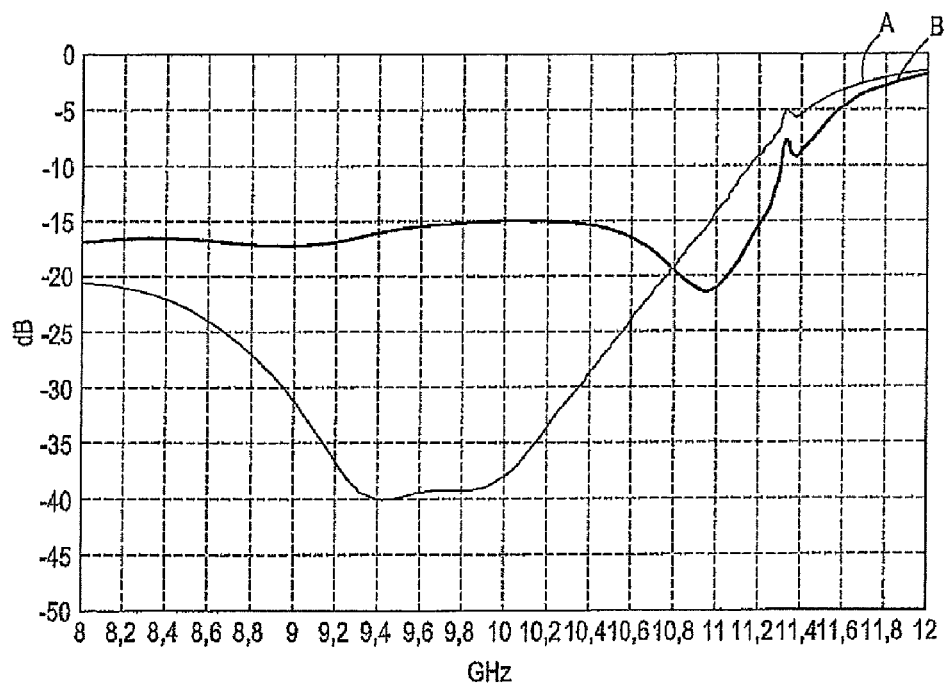
FIG. 10 is a graph showing return signal losses at RF ports of a microwave circulator, with and without the elastomeric mattress.
Figure 11:
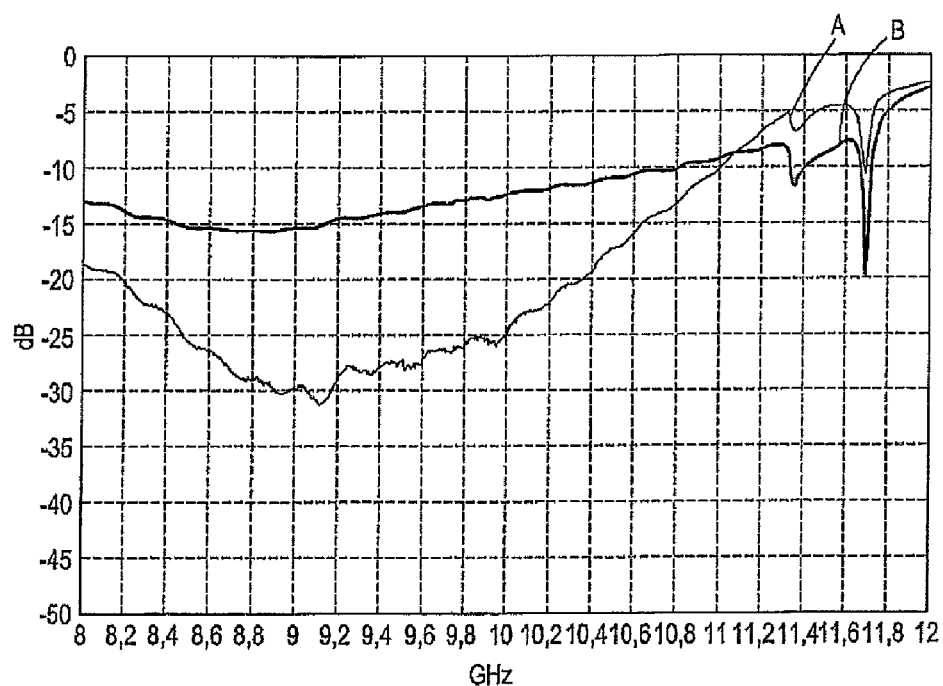
FIG. 11 is a graph corresponding to FIG. 10, showing return signal losses between different RF ports of the same microwave circulator, with and without the elastomeric mattress.

Similar comparisons, of the same MESL circulator, are illustrated in FIGS. 10 and 11, which relate respectively to input match and output match, i.e. the corresponding RF signal return losses seen at the ports of the circulator. In each of FIG. 10 and FIG. 11, graph A shows the return loss without the elastomeric mattress, and graph B shows the return loss with the same Shin Etsu elastomeric mattress interposed. These graphs illustrate how the return losses are deeply degraded using the elastomeric mattress.

Figure 12:
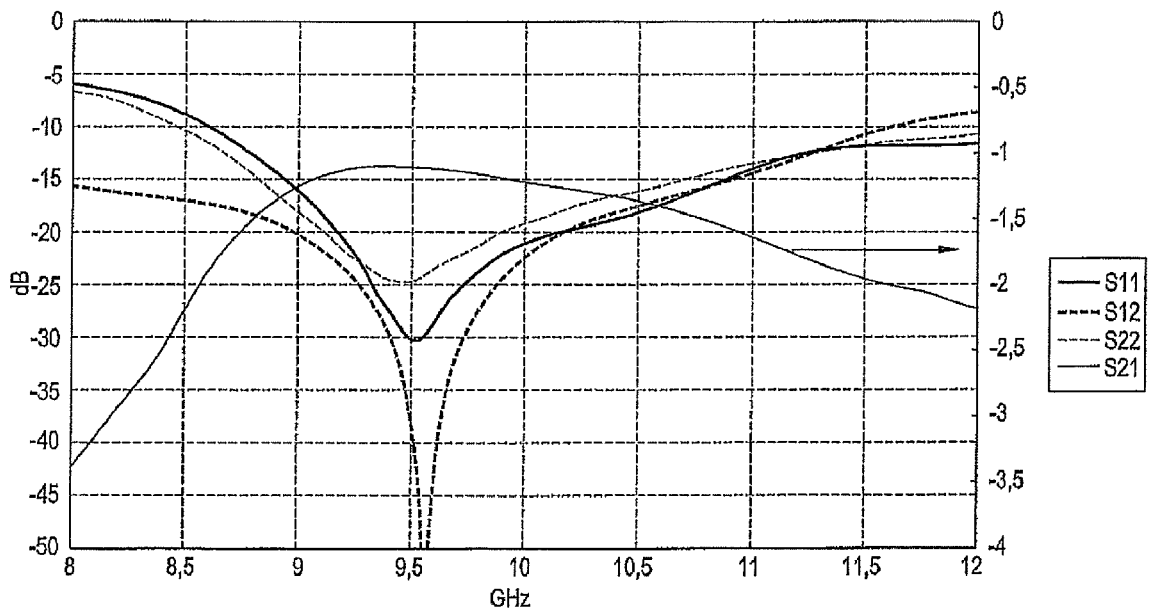
FIG. 12 is a graph showing RF signal losses for four different paths through the same microwave circulator, without any interposed mattress.
Figure 13:
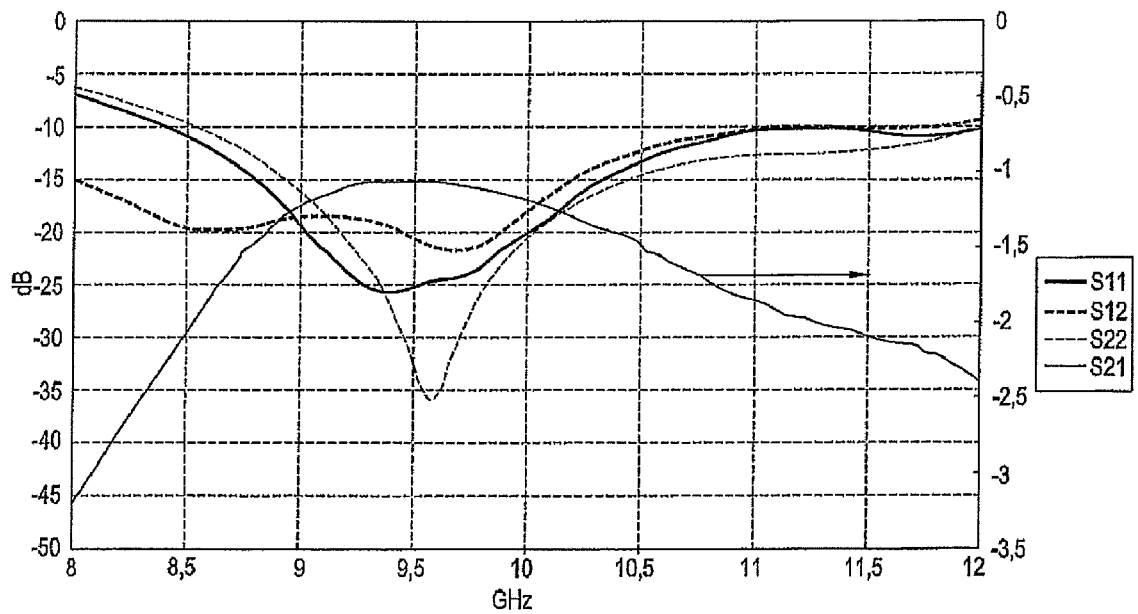
FIG. 13 is a graph corresponding to FIG. 12, but with an interposed RF adaptor layer, in accordance with the method of the invention.

FIGS. 12 and 13 illustrate the effect of the adaptor layer, in accordance with the method of the invention, on the RF performance of an XZM9966 microwave circulator (Microwave Limited, Lochend Industrial Estate, Newbridge, Edinburgh, EH28 8LP, Scotland). The graph of FIG. 12 shows the return losses without the adaptor layer, for four different transmission paths S11, S12, S22 and S21. FIG. 13 corresponds to FIG. 12, but with the adaptor layer interposed, in accordance with the preferred embodiment of the invention. As it can be seen from a comparison of FIGS. 12 and 13, the impact of the adaptor layer is virtually negligible on the circulator RF performance, and it shows a significant improvement in comparison to the use of the interposed elastomeric mattress, with reference to FIGS. 9 to 11.

Although the invention provides the advantage of allowing fine tuning before the balling process, the adaptor system can also be used for RF testing of an integrated circuit package that has already been assembled to the BGA.

The invention claimed is:

1. A method of manufacturing an integrated circuit ("IC") package comprising radio frequency ("RF") components, the method comprising:

electrically connecting a printed circuit pattern on an external major surface of an IC assembly to an RF testing motherboard by bringing them together with an interposed adaptor layer, the adaptor layer comprising a double-sided printed circuit board ("PCB") with conductive vias between its printed circuit layers;

RF testing the IC assembly using the RF testing motherboard, whilst RF tuning components of the IC assembly; and separating the IC assembly and connecting its major surface to a solder ball grid array ("BGA") which has substantially the same RF impedance as the adaptor at RF signal paths from the IC assembly to the BGA;

wherein the adaptor layer substantially simulates an impedance of the BGA at the RF wavebands over which the IC assembly operates.

2. A method according to claim 1, comprising applying a predetermined normal pressure between the IC package, the adaptor layer and the RF testing motherboard.

3. A method according to claim 1, wherein spacings between the vias in the adaptor layer correspond to spacings between balls of the BGA.

4. A method according to claim 1, wherein the signal paths between the IC assembly and the BGA comprise coaxial signal paths consisting of a central signal path to one ball surrounded by plural grounded balls of the BGA.

5. A method according to claim 4, wherein the impedances of these coaxial signal paths are in the range of 40Ω to 60Ω.

6. A method according to claim 5, wherein the impedances are substantially 50Ω.

7. A method according to claim 1, wherein the IC assembly comprises a microwave circulator and the method comprises RF tuning ports of the microwave circulator before connection to the BGA.

* * * * *